(12) United States Patent
Otsuka et al.

(10) Patent No.: US 7,579,928 B2
(45) Date of Patent: Aug. 25, 2009

(54) SURFACE ACOUSTIC WAVE DEVICE AND COMMUNICATION DEVICE

(75) Inventors: Kazuhiro Otsuka, Kyoto (JP); Tsuyoshi Nakai, Kyoto (JP); Hiroyuki Tanaka, Kyoto (JP)

(73) Assignee: Kyocera Corporation, Kyoto (JP)

( * ) Notice: Subject to any disclaimer, the term of this patent is extended or adjusted under 35 U.S.C. 154(b) by 256 days.

(21) Appl. No.: 11/729,953

(22) Filed: Mar. 30, 2007

(65) Prior Publication Data

US 2007/0290770 A1    Dec. 20, 2007

(30) Foreign Application Priority Data

Apr. 3, 2006  (JP)  .............................. 2006-102499
Apr. 3, 2006  (JP)  .............................. 2006-102500

(51) Int. Cl.
H03H 9/72   (2006.01)
H03H 9/64   (2006.01)

(52) U.S. Cl. ........................ 333/133; 333/193; 333/195; 310/313 B

(58) Field of Classification Search ................. 333/193, 333/195, 133; 310/313 B, 313 D
See application file for complete search history.

(56) References Cited

U.S. PATENT DOCUMENTS 6,744,333 B2 *  6/2004  Sawada ....................... 333/133
6,781,485 B2 *  8/2004  Takamine et al. ............ 333/195
2004/0189147 A1 *  9/2004  Ito et al. .................. 310/313 B
2004/0196119 A1 * 10/2004  Shibahara et al. ........... 333/193
2005/0116352 A1 *  6/2005  Warashina et al. ........... 257/777
2006/0044081 A1 *  3/2006  Tanaka et al. ............... 333/195
2007/0018756 A1 *  1/2007  Fujii et al. .................. 333/193

FOREIGN PATENT DOCUMENTS

JP        11-097966      4/1999
JP        2002-084164    3/2002
WO      WO 2006/009021   *  1/2006

* cited by examiner

Primary Examiner—Barbara Summons
(74) Attorney, Agent, or Firm—Morrison and Foerster LLP

(57) ABSTRACT

A surface acoustic wave device includes front stage and rear stage surface acoustic wave elements, a signal wiring connecting between the front stage and rear stage surface acoustic wave elements, a reference potential wiring connected with the rear stage surface acoustic wave element and a capacitor made of an insulator interposed between the signal wiring and the reference potential wiring. A surface acoustic wave device includes a front stage surface acoustic wave resonator, a rear stage surface acoustic wave element, a signal wiring connecting between the front stage surface acoustic wave resonator and the rear stage surface acoustic wave element, a reference potential wiring connected with the rear stage surface acoustic wave element and a capacitor made of an insulator interposed between the signal wiring and the reference potential wiring. A communication device includes the surface acoustic wave device described above, a receiver circuit or a transmitter circuit.

18 Claims, 15 Drawing Sheets

First Reference Example

Second Reference Example

_US 7,579,928 B2_

SURFACE ACOUSTIC WAVE DEVICE AND COMMUNICATION DEVICE

CROSS-REFERENCE TO RELATED APPLICATIONS

The present application claims priority under 35 U.S.C. §119 to Japanese Patent Applications No. 2006-102499, filed Apr. 3, 2006, and No. 2006-102500, filed Apr. 3, 2006, entitled "SURFACE ACOUSTIC WAVE DEVICE AND COMMUNICATION DEVICE." The contents of these applications are incorporated herein by reference in their entirety.

BACKGROUND OF THE INVENTION

1. Field of the Invention

This invention relates to a surface acoustic wave device such as a surface acoustic wave filter or a surface acoustic wave resonator and a communication device equipped with the surface acoustic wave device used in a mobile communication device such as a mobile phone or the like.

2. Description of the Related Art

The surface acoustic wave filter has been widely used as a frequency selection filter used in an RF (Radio Frequency) stage in the mobile communication devices such as a mobile phone and an automobile telephone. In order to reduce a size, a weight and a cost of the mobile communication device, the number of components used in the mobile communication device has been sought to be reduced, and the surface acoustic wave filter has been required to include additional functions. For example, there is a requirement for an unbalanced input-balanced output type surface acoustic wave filter or a balanced input-unbalanced output type surface acoustic wave filter (hereafter referred to as a balanced type surface acoustic wave filter).

In order to satisfy the requirement, an in-line coupled double mode filter is used often. When used as an RF filter, it is often required that one of connecting terminals is of an unbalanced connection with an input/output impedance of 50Ω and the other connecting terminal is of balanced connection with an aligned input/output impedance of 100-200 Ω.

The unbalanced input-balanced output type surface acoustic wave filter means a surface acoustic wave filter having an unbalanced input and a balanced output. The balanced input-unbalanced output type surface acoustic wave filter means a surface acoustic wave filter having a balanced input and an unbalance output. The balanced input or the balanced output means that a signal is inputted or outputted as a difference in electric potential between two signal lines carrying signals that are equal in amplitude and reverse in phase to each other. On the other hand, the unbalanced input or the unbalanced output means that a signal is inputted or outputted as an electric potential on a single line against a ground electric potential.

FIG. 12 is a plan view schematically showing a conventional balanced type surface acoustic wave filter. The balanced type surface acoustic wave filter has surface acoustic wave filters 212 and 213 disposed on a piezoelectric substrate 201 and connected in parallel to each other. The surface acoustic wave filter 212 has three IDT (Interdigital Transducer) electrodes 202, 203 and 204 and reflector electrodes 208 and 209 disposed on both sides of the IDT electrodes 202, 203 and 204. Also, the surface acoustic wave filter 213 has three IDT electrodes 205, 206 and 207 and reflector electrodes 210 and 211 disposed on both sides of the IDT electrodes 205, 206 and 207.

The surface acoustic wave filters 212 and 213 are connected in parallel to each other and together connected to an unbalanced signal terminal 214. The IDT electrodes 202, 204, 205 and 207, which are connected together to the unbalanced signal terminal 214, generate surface acoustic waves when an electric field is applied across a pair of comb-shaped electrodes facing each other in each of them. The generated surface acoustic waves are propagated to the IDT electrodes 203 and 206, each located in the middle of each of the surface acoustic wave filters 212 and 213, respectively. A phase of the IDT electrode 203 in the middle of the surface acoustic wave filter 212 is reverse to, i.e. 180 degrees different from, a phase of the IDT electrode 206 in the middle of the surface acoustic wave filter 213. The surface acoustic waves are propagated from each of the middle IDT electrodes 203 and 206 to each of balanced output signal terminals 215 and 216, respectively, from which the surface acoustic waves are outputted as balanced outputs. Here, the phase of the IDT electrode 203 means a phase of an electric signal that is outputted from the IDT electrode 203. Similar descriptions are used hereafter for the sake of simplicity. A balanced-unbalanced conversion function is realized with the structure described above.

An unbalanced-balanced conversion function can be realized by using the conventional balanced type surface acoustic wave filter shown in FIG. 12. However, the conventional balanced type surface acoustic wave filter is poor in balance. Here, the balance includes amplitude balance and phase balance. When a signal is inputted or outputted as an electric potential difference between two signal lines, the amplitude balance is as better as closer to each other absolute values of amplitudes of signals on the signal lines are. Also, the phase balance is as better as closer to 180 degrees a difference between phases of the signals is.

On the other hand, a balanced type surface acoustic wave element shown in FIG. 13 is proposed. An example of this structure is disclosed in Japanese Patent Application Publication No. H11-97966. An unbalanced terminal 221 is connected with an IDT electrode 203 in the middle of a first stage of an in-line coupled double mode surface acoustic wave filter, which includes three IDT electrodes 202, 203 and 204 interposed between reflector electrodes 210 and 211. Each of the IDT electrodes 202 and 204 in the first stage is serially connected with each of IDT electrodes 205 and 207 in a second stage, respectively. An IDT electrode 206 in the middle of the second stage is divided into two portions which are configured to be reverse in phase to each other and connected to balanced signal terminals 222 and 223, respectively. With this, an unbalanced input with an input impedance of 50Ω and a balanced output with an output impedance of 200Ω are obtained.

It is also possible to use a structure in which the two stage surface acoustic wave element shown in FIG. 13 is serially connected with another in-line coupled surface acoustic wave element that has three IDT electrodes closely disposed along a direction of propagation of the surface acoustic waves and reflector electrodes on both sides of them. Even with this structure, however, the amplitude balance and the phase balance are not good enough.

In Japanese Patent Application Publication No. 2002-84164, there is proposed a structure to improve the balance of conventional double mode surface acoustic wave resonator filter by forming even-number of pairs of IDT electrodes that are disposed in the middle of three IDT electrodes aligned in the propagation direction of surface acoustic waves. However, the amplitude balance and the phase balance of a balanced type surface acoustic wave filter of the structure mentioned above are not good because a polarity of outermost finger of the middle IDT electrode and a polarity of outermost finger of the IDT electrode adjacent the middle IDT electrode differ between left and right and thus parasitic capacitances formed at balanced signal terminals differ from each other.

Therefore, improving the amplitude balance and the phase balance has been sought in the conventional balanced type surface acoustic wave filters. In addition, communication devices using the conventional balanced type surface acoustic wave devices have been not satisfactory in sensitivity.

SUMMARY OF THE INVENTION

This invention is directed to offer a surface acoustic wave device that provides improvement in balance (amplitude balance and phase balance) of a balanced type surface acoustic wave filter. This invention is also directed to offer a communication device having a high sensitivity.

A surface acoustic wave device according to an embodiment of this invention includes front stage and rear stage surface acoustic wave elements, a signal wiring connecting between the front stage and rear stage surface acoustic wave elements, a reference potential wiring connected with the rear stage surface acoustic wave element and a capacitor made of an insulator interposed between the signal wiring and the reference potential wiring.

A surface acoustic wave device according to another embodiment of this invention includes a front stage surface acoustic wave resonator, a rear stage surface acoustic wave element, a signal wiring connecting between the front stage surface acoustic wave resonator and the rear stage surface acoustic wave element, a reference potential wiring connected with the rear stage surface acoustic wave element and a capacitor made of an insulator interposed between the signal wiring and the reference potential wiring.

A communication device according to an embodiment of this invention includes the surface acoustic wave device described above, a receiver circuit or a transmitter circuit.

DETAILED DESCRIPTION OF THE PREFERRED EMBODIMENTS

Figure 1:
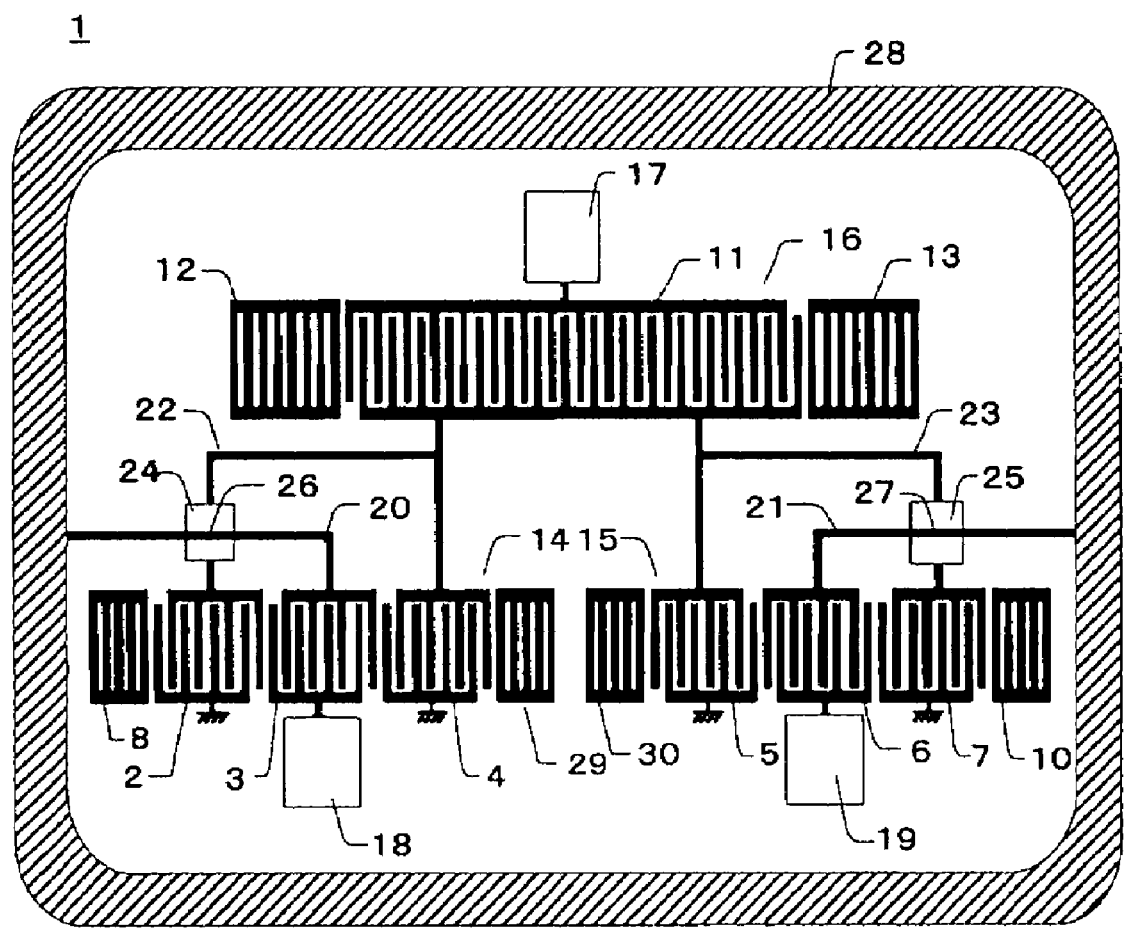
FIG. 1 is a plan view showing a surface acoustic wave device according to an example of a first embodiment of this invention.

Surface acoustic wave devices according to embodiments of this invention will be described referring to the drawings. A resonator type surface acoustic wave filter having a simple structure is explained as an example. Sizes of electrodes, distances between the electrodes, the number of and spacing between electrode fingers and the like are schematically shown for the explanation.

A surface acoustic wave device according to an example of a first embodiment of this invention has a surface acoustic wave resonator 16 provided in a front stage and two surface acoustic wave elements 14 and 15 provided in a rear stage, as shown in FIG. 1. The two surface acoustic wave elements 14 and 15 in the rear stage are connected in parallel through the surface acoustic wave resonator 16 in the front stage.

The surface acoustic wave resonator 16 in the front stage is composed of an IDT electrode 11 and reflector electrodes 12 and 13 disposed on a piezoelectric substrate 1. The IDT electrode 11 and the reflector electrodes 12 and 13 are disposed along a propagation direction of surface acoustic waves propagating through a surface of the piezoelectric substrate 1, and each of them is provided with a plurality of electrode fingers extending perpendicular to the propagation direction of the surface acoustic waves. The reflector electrode 12 is disposed to the left of the IDT electrode 11, while the reflector electrode 13 is disposed to the right of the IDT electrode 11.

The two surface acoustic wave elements 14 and 15 in the rear stage are composed of a first surface acoustic wave element 14 and a second surface acoustic wave element 15. Each of the first and second surface acoustic wave elements 14 and 15 is composed of a group of three or more than three odd-number of IDT electrodes and reflector electrodes provided on both sides of the group of IDT electrodes.

The first surface acoustic wave element 14 is provided with a group of IDT electrodes 2, 3 and 4, disposed on the piezoelectric substrate 1 along a propagation direction of surface acoustic waves propagating through the surface of the piezoelectric substrate 1. Each of the IDT electrodes 2, 3 and 4 is provided with a plurality of electrode fingers extending perpendicular to the propagation direction of the surface acoustic waves. A reflector electrode 8 is disposed to the left of the group of the IDT electrodes, while a reflector electrode 29 is disposed to the right of the group of the IDT electrodes.

The second surface acoustic wave element 15 is provided with a group of IDT electrodes 5, 6 and 7. The IDT electrodes 5, 6 and 7 are disposed along a propagation direction of surface acoustic waves propagating through the surface of the piezoelectric substrate 1, and each of them is provided with a plurality of electrode fingers extending perpendicular to the propagation direction of the surface acoustic waves. A reflector electrode 30 is disposed to the left of the group of the IDT electrodes, while a reflector electrode 10 is disposed to the right of the group of the IDT electrodes.

An unbalanced input/output terminal (unbalanced input terminal or unbalanced output terminal) 17 is connected with the IDT electrode 11 that constitutes the surface acoustic wave resonator 16 in the front stage. A balanced input/output terminal (balanced input terminal or balanced output terminal) 18 is connected with the IDT electrode 3 in the middle of the group of the IDT electrodes constituting the first surface acoustic wave element 14 in the rear stage. A balanced input/output terminal 19 is connected with the IDT electrode 6 in the middle of the group of the IDT electrodes constituting the second surface acoustic wave element 15 in the rear stage.

The IDT electrodes 2 and 4 out of the three IDT electrodes 2, 3 and 4 constituting the first surface acoustic wave element 14 is connected in parallel with the IDT electrode 11 in the front stage through a signal wiring 22. The IDT electrodes 5 and 7 out of the three IDT electrodes constituting the second surface acoustic wave element 15 is connected in parallel with the IDT electrode 11 in the front stage through a signal wiring 23.

A reference potential wiring 20 is connected with the IDT electrode 3 in the middle of the group of the IDT electrodes constituting the first surface acoustic wave element 14. A reference potential wiring 21 is connected with the IDT electrode 6 in the middle of the group of the IDT electrodes constituting the second surface acoustic wave element 15.

Each of the reference potential wirings 20 and 21 connects between a reference electric potential electrode (annular electrode) 28 and each of the IDT electrodes 3 and 6 in the rear stage, respectively. The reference electric potential electrode 28 is a ground electrode or the like. The reference electric potential electrode 28 is not necessarily the ground electric potential electrode that is held at a ground electric potential, and may be an electrode that is held at another electric potential in a certain range.

The reference potential wiring 20 intersects the signal wiring 22 through an insulator 24. The reference potential wiring 21 intersects the signal wiring 23 through an insulator 25. Each of capacitors 26 and 27 is formed at each of the intersections. That is, the capacitor 26 is composed of a portion of the signal wiring 22, a portion of the reference potential wiring 20 facing the part of the signal wiring 22 and the insulator 24 interposed between the portion of the wiring 20 and the portion of the wiring 22. Similarly, the capacitor 27 is composed of a portion of the signal wiring 23, a portion of the reference potential wiring 21 facing the portion of the signal wiring 23 and the insulator 25 interposed between the portion of the wiring 21 and the portion of the wiring 23.

In the conventional structure, when there is a difference between the first and second surface acoustic wave elements in structures such as electrode patterns in peripheries of the first and second surface acoustic wave elements, which cause parasitic capacitances, amplitudes of signals propagating to the balanced output terminals become different from each other and phases of the signals are deviated from the phases reverse to each other to degrade the balance. With the example of the first embodiment of this invention, on the other hand, the capacitances introduced into the equivalent circuit of the surface acoustic wave device can be adjusted in the first surface acoustic wave element 14 and the second surface acoustic wave element 15 by providing the capacitors 26 and 27, making it possible to improve the amplitude balance and the phase balance.

Figure 14:
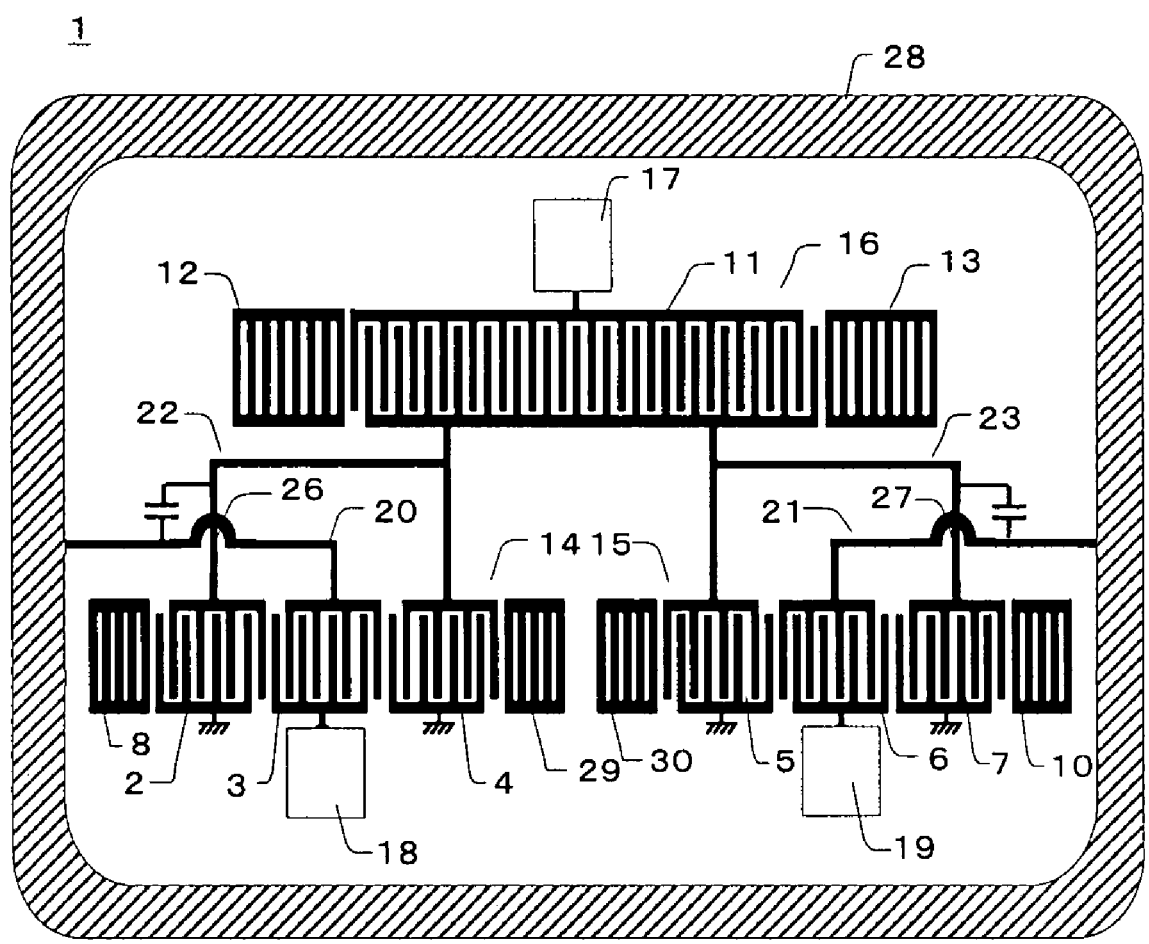
FIG. 14 is a plan view in which capacitors are represented as equivalent circuit elements, regarding the surface acoustic wave device according to the example of the first embodiment of this invention shown in FIG. 1.

FIG. 14 is a plan view in which the capacitors 26 and 27 are represented as equivalent circuit elements, regarding the surface acoustic wave device according to the example of the first embodiment of this invention shown in FIG. 1. A capacitor is formed between each of portions of the signal wirings 22 and 23 and corresponding each of the portions of the reference potential wirings 20 and 21 facing the portions of the signal wirings 22 and 23, as shown in FIG. 14.

In addition, the balanced type surface acoustic wave device can be realized with the structure, in which the first surface acoustic wave element 14 and the second surface acoustic wave element 15 are connected in parallel through the surface acoustic wave resonator 16, without degrading the insertion loss in the pass band of the surface acoustic wave elements 14 and 15. The balanced type surface acoustic wave device implements an unbalanced input-balanced output type surface acoustic wave filter or a balanced input-unbalanced output type surface acoustic wave filter that has the unbalanced-balanced conversion function or the balanced-unbalanced conversion function.

With the structure of the surface acoustic wave device according to the example of the first embodiment of this invention, there is no need to dispose a ground pad electrode or the like between the surface acoustic wave resonator 16 and the surface acoustic elements 14 and 15. As a result, the surface acoustic wave resonator 16 and the first and second surface acoustic wave elements 14 and 15 can be placed very closely and it is made possible to layout the ground pad electrode or the like outside a region between the surface acoustic wave resonator 16 and the first and second surface acoustic elements 14 and 15 and outside a region between the first and second surface acoustic wave elements 14 and 15. Therefore, areas occupied by the surface acoustic wave resonator 16, the first and second surface acoustic elements 14 and 15 and the wiring patterns can be minimized to reduce the size of the surface acoustic wave device.

Silicon oxide or polyimide resin is favorably used as the insulators 24 and 25 used in the capacitors 26 and 27. Insulation between each of the signal wirings 22 and 23 and each of the reference potential wirings 20 and 21, respectively, can be favorably maintained with it. Desired capacitances can be formed between the surface acoustic resonator 16 and the first and second surface acoustic wave elements 14 and 15 by adjusting areas of the wirings in the capacitors 26 and 27 and thicknesses of the insulators 24 and 25. The balance of the surface acoustic wave device can be improved with the attached capacitances.

The reference potential wirings 20 and 21 are connected with an annular electrode 28 that is formed on the piezoelectric substrate 1 to surround the surface acoustic wave device. As a result, it is made possible that the capacitances introduced into the equivalent circuit of the surface acoustic wave device are adjusted in the first surface acoustic wave element 14 and the second surface acoustic wave element 15 by the capacitors 26 and 27 formed between the surface acoustic wave resonator 16 and the first and second surface acoustic wave elements 14 and 15 and that the amplitude balance and the phase balance are improved.

In addition, since the reference potential wirings 20 and 21 are connected with the annular electrode 28 formed to surround the surface acoustic wave resonator 16 and the first and second surface acoustic wave elements 14 and 15 in this structure, there is no need to dispose the ground pad electrode between the surface acoustic wave resonator 16 and the first and second surface acoustic wave elements 14 and 15 and between the first and second surface acoustic wave elements 14 and 15, thereby ground electrodes can be unified and the areas occupied by the surface acoustic wave resonator 16, the first and second surface acoustic wave elements 14 and 15 and the wiring patterns can be minimized to reduce the size of the surface acoustic wave device.

Also, it is possible that an annular conductor is formed on an external circuit board in a pattern facing the annular electrode 28 and the surface acoustic wave device is face-down mounted on the circuit board by bonding the annular electrode 28 to the annular conductor with a connecting material such as solder to seal their periphery. In this case, enough hermeticity of the surface acoustic wave device can be secured to offer a surface acoustic wave device that is small in size and excellent in reliability.

And it is also feasible that at least one of the capacitors 26 and 27 is formed in one of the first and second surface acoustic wave elements 14 and 15 and the reference potential wirings 20 and 21 are connected with the annular electrode 28, as shown in FIG. 1.

Figure 2:
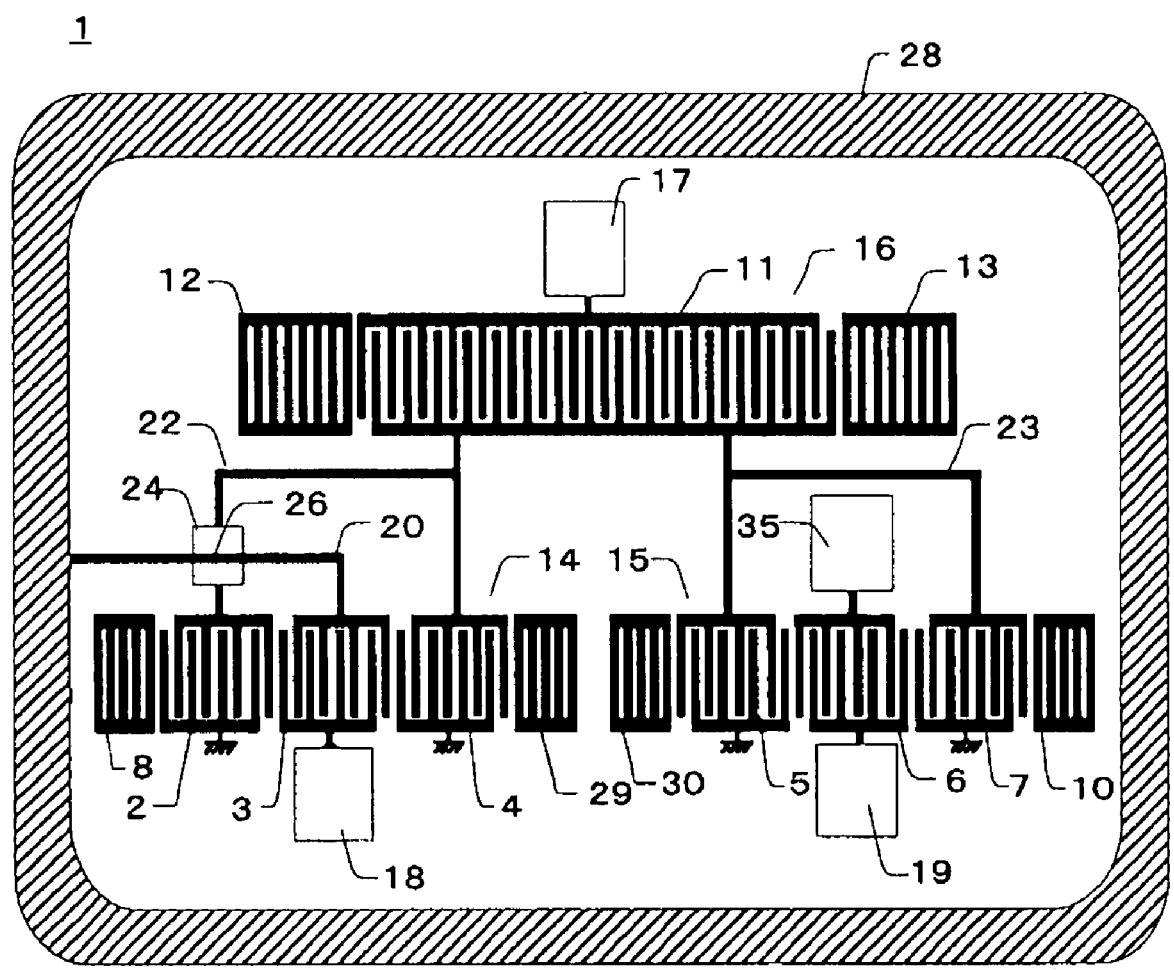
FIG. 2 is a plan view showing a surface acoustic wave device according to another example of the first embodiment of this invention.

A surface acoustic wave device according to another example of the first embodiment of this invention is shown in FIG. 2. The surface acoustic wave device shown in FIG. 2 is provided with a single capacitor, while the surface acoustic wave device shown in FIG. 1 is provided with the two capacitors. That is, the capacitor may be provided to either reference potential wiring between a surface acoustic wave resonator 16 and a first surface acoustic wave element 14 or reference potential wiring between the surface acoustic wave resonator 16 and a second surface acoustic wave element 15.

In FIG. 2, a capacitor 26 is formed at an intersection of a reference potential wiring 20 connected with an IDT electrode 3 in the first surface acoustic wave element 14 and a signal wiring 22 connecting the surface acoustic wave resonator 16 with the first surface acoustic wave element 14. In this case, similar to the case shown in FIG. 1, the balance of the surface acoustic wave device can be improved by adjusting a capacitance attached to either the first surface acoustic wave element 14 or the second surface acoustic wave element 15. A numeral 35 in FIG. 2 denotes a ground electrode.

The capacitor may be formed at an intersection of a reference potential wiring connected with an IDT electrode 6 in the second surface acoustic wave element 15 and a signal wiring connecting the surface acoustic wave resonator 16 with the second surface acoustic wave element 15, instead of at the intersection of the reference potential wiring 20 and the signal wiring 22 as shown in FIG. 2.

Figure 3:
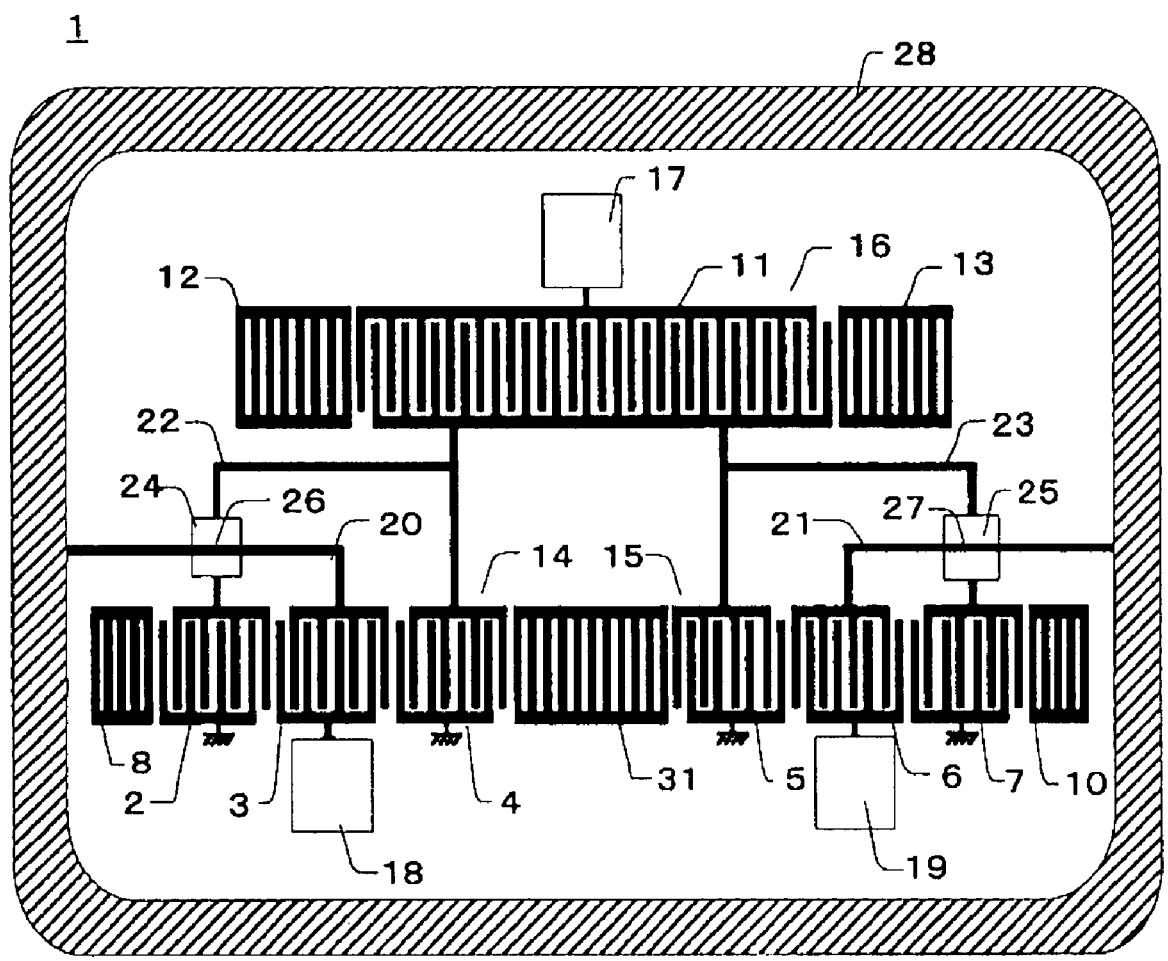
FIG. 3 is a plan view showing a surface acoustic wave device according to still another example of the first embodiment of this invention.

A surface acoustic wave device according to still another example of the first embodiment of this invention is shown in FIG. 3. The reflector electrodes 29 and 30 in the surface acoustic wave device shown in FIG. 1 are merged into a single reflector electrode 31 in the surface acoustic wave device shown in FIG. 3. That is, a first surface acoustic wave element 14 and a second surface acoustic wave element 15 share the unified reflector electrode 31 that is formed in a border region between them. Surface acoustic waves generated in the two surface acoustic wave elements 14 and 15 cancel out each other in the reflector electrode 31 with their phases being opposite in polarity to each other to improve reflection characteristics. As a result, generation of small ripples in the pass band can be further suppressed.

Also, sharing the common reflector 31 formed in the border region between the first and second surface acoustic wave elements 14 and 15 makes it possible to reduce the area occupied by the first and second surface acoustic wave elements 14 and 15 and thereby to reduce the size of the surface acoustic wave device.

Figure 4:
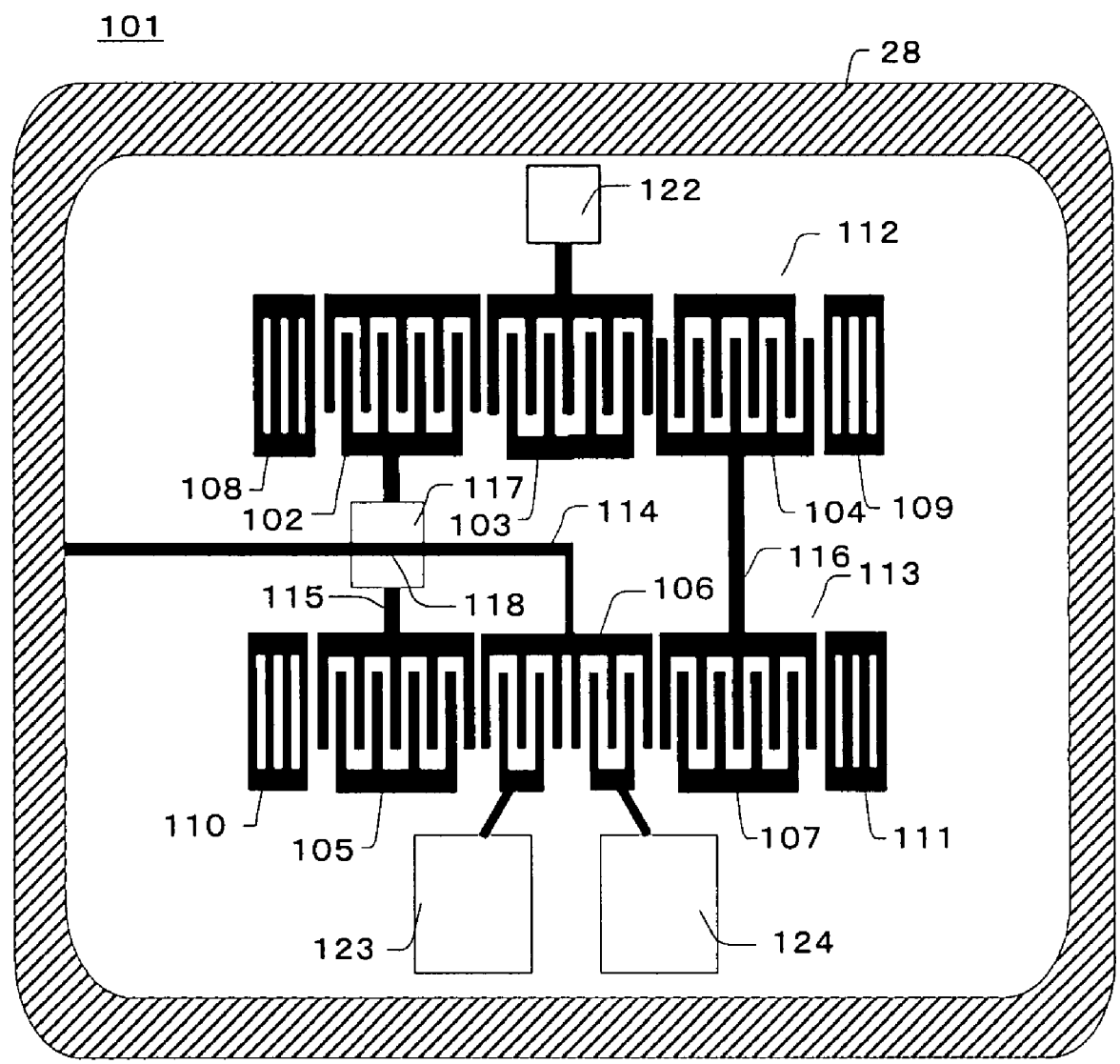
FIG. 4 is a plan view showing a surface acoustic wave device according to an example of a second embodiment of this invention.

A surface acoustic wave device according to an example of a second embodiment of this invention is provided with a front stage surface acoustic wave element 112 disposed in a front stage and a rear stage surface acoustic wave element 113 disposed in a rear stage, as shown in FIG. 4. The front stage surface acoustic wave element 112 and the rear stage surface acoustic wave element 113 are serially connected.

IDT electrodes 102-107 and reflector electrodes 108-111 are provided on a piezoelectric substrate 101 along a propagation direction of surface acoustic waves propagating through a surface of the piezoelectric substrate 101. Out of the IDT electrodes 102-107, three IDT electrodes 102-104 make a group, while the other three IDT electrodes 105-107 make another group. The reflector electrodes 108 and 109 are disposed on both sides of the group of IDT electrodes 102-104, while the reflector electrodes 110 and 111 are disposed on both sides of the group of IDT electrodes 105-107.

That is, the surface acoustic wave device is composed of the front stage surface acoustic wave element 112 and the rear stage surface acoustic wave element 113 connected in series on the piezoelectric substrate 101. The front stage surface acoustic wave element 112 is composed of the three IDT electrodes 102-104 and the reflector electrodes 108 and 109 disposed on both sides of the IDT electrodes 102-104, which are disposed along the propagation direction of the surface acoustic waves propagating through the surface of the piezoelectric substrate 101. The rear stage surface acoustic wave element 113 is composed of the three IDT electrodes 105-107 and the reflector electrodes 110 and 111 disposed on both sides of the IDT electrodes 105-107, which are disposed along the propagation direction of the surface acoustic waves. Each of the IDT electrodes 102-107 and the reflector electrodes 108-111 is provided with a plurality of electrode fingers extending perpendicular to the propagation direction of the surface acoustic waves.

An unbalanced input/output terminal 122 is connected to the front stage surface acoustic wave element 112. Signals are inputted or outputted through the unbalanced input/output terminal 122. An unbalanced input signal is inputted to the unbalanced input/output terminal 122, or an unbalanced output is outputted from the unbalanced input/output terminal 122, for example.

Two balanced input/output terminals 123 and 124 are connected to the rear stage surface acoustic wave element 113. When the unbalanced input/output terminal 122 connected with the front stage surface acoustic wave element 112 serves as an unbalanced input terminal, the balanced input/output terminals 123 and 124 connected with the rear stage surface acoustic wave element 113 serve as balanced output terminals. When the unbalanced input/output terminal 122 connected with the front stage surface acoustic wave element 112 serves as an unbalanced output terminal, the balanced input/output terminals 123 and 124 connected with the rear stage surface acoustic wave element 113 serve as balanced input terminals.

There is provided a reference potential wiring 114 connected with the IDT electrode 106 in the rear stage surface acoustic wave element 113. There is provided a signal wiring 115 serially connecting the front stage surface acoustic wave element 112 with the rear stage surface acoustic wave element 113.

The reference potential wiring 114 intersects the signal wiring 115 three-dimensionally through an insulator 117 to form a capacitor 118 that is composed of a portion of the signal wiring 115, a portion of the reference potential wiring 114 facing the portion of the signal wiring 115 and the insulator interposed between the both portions of the wirings.

That is, the reference potential wiring 114 connected with the IDT electrode 106 in the rear stage surface acoustic wave element 113 intersects the signal wiring 115 serially connecting the front stage surface acoustic wave element 112 with the rear stage surface acoustic wave element 113 through the insulator 117. The capacitor 118 having a structure in which the reference potential wiring 114 and the signal wiring 115 interpose the insulator 117 is disposed at the intersection.

In some cases where there is a difference between the front stage surface acoustic wave element 112 and the rear stage surface acoustic wave element 113 in structures such as electrode patterns in peripheries which cause parasitic capacitances, amplitudes of signals propagating to the balanced output terminal become different from each other and phases of the signals are deviated from the reverse phase to each other to degrade the balance. However, by providing the surface acoustic wave device according to the example of the second embodiment of this invention with the capacitor 118, capacitances introduced into the equivalent circuit can be adjusted between the balanced outputs (or the balanced inputs). That is, the amplitude balance and the phase balance can be improved because amplitudes and phases of the output signals of the two balanced input/output terminals 123 and 124 can be adjusted.

Also, with the structure described above, there is no need to dispose a ground pad electrode or the like between the front stage surface acoustic wave element 112 and the rear stage surface acoustic wave element 113, the front stage surface acoustic wave element 112 and the rear stage surface acoustic wave element 113 can be placed very closely, and it is made possible to layout the ground pad electrode or the like outside a region between the surface acoustic wave elements and to reduce the size of the surface acoustic wave device by reducing an area of the surface acoustic wave elements as much as possible.

A thickness of the insulator 117 is preferably about 0.5 to 6 μm. When it is thinner than 0.5 μm, there is caused a large electric capacitance that has detrimental effect on electrical characteristics of the surface acoustic wave element. And when it exceeds 6 μm, upper wiring electrode is more likely to be broken.

The insulator 117 is formed by a build-up method or the like. The insulator 117 may be formed as a structure of stacked layers of insulators. A dielectric constant of the insulator 117 can be adjusted to a desired value by mixing particles of insulator such as alumina ceramics or particles of metal such as silver into the insulator 117, or by making the insulator 117 a porous material in which a large number of air bubbles are formed.

Out of the reference potential wiring 114 and the signal wiring 115, one which is disposed over the insulator 117 in the capacitor 118, in which the reference potential wiring 114 intersects the signal wiring 115 through the insulator 117, may be formed to have a greater width (referred to as a width b) in the capacitor 118 than a width (referred to as a width a) of the same wiring in the other area, and the width b may be reduced by laser radiation or etching to adjust the capacitance.

Or, the width b may be formed to be equal to the width a, and then the width b may be made larger than the width a in the adjustment of the capacitance by forming a solder layer or a metal layer that is attached to the wiring of the width b.

That is, methods to adjust the capacitance of the capacitor in the surface acoustic wave device includes; 1) mixing into the insulator particles of an insulative material that has a dielectric constant different from that of the insulator or particles of a metal, 2) varying either the width of the reference potential wiring or the width of the signal wiring in the capacitor, 3) forming a first capacitor on a side of one of the surface acoustic wave elements and a second capacitor on a side of the other surface acoustic wave elements and making materials or thicknesses of the capacitors different from each other.

Figure 5:
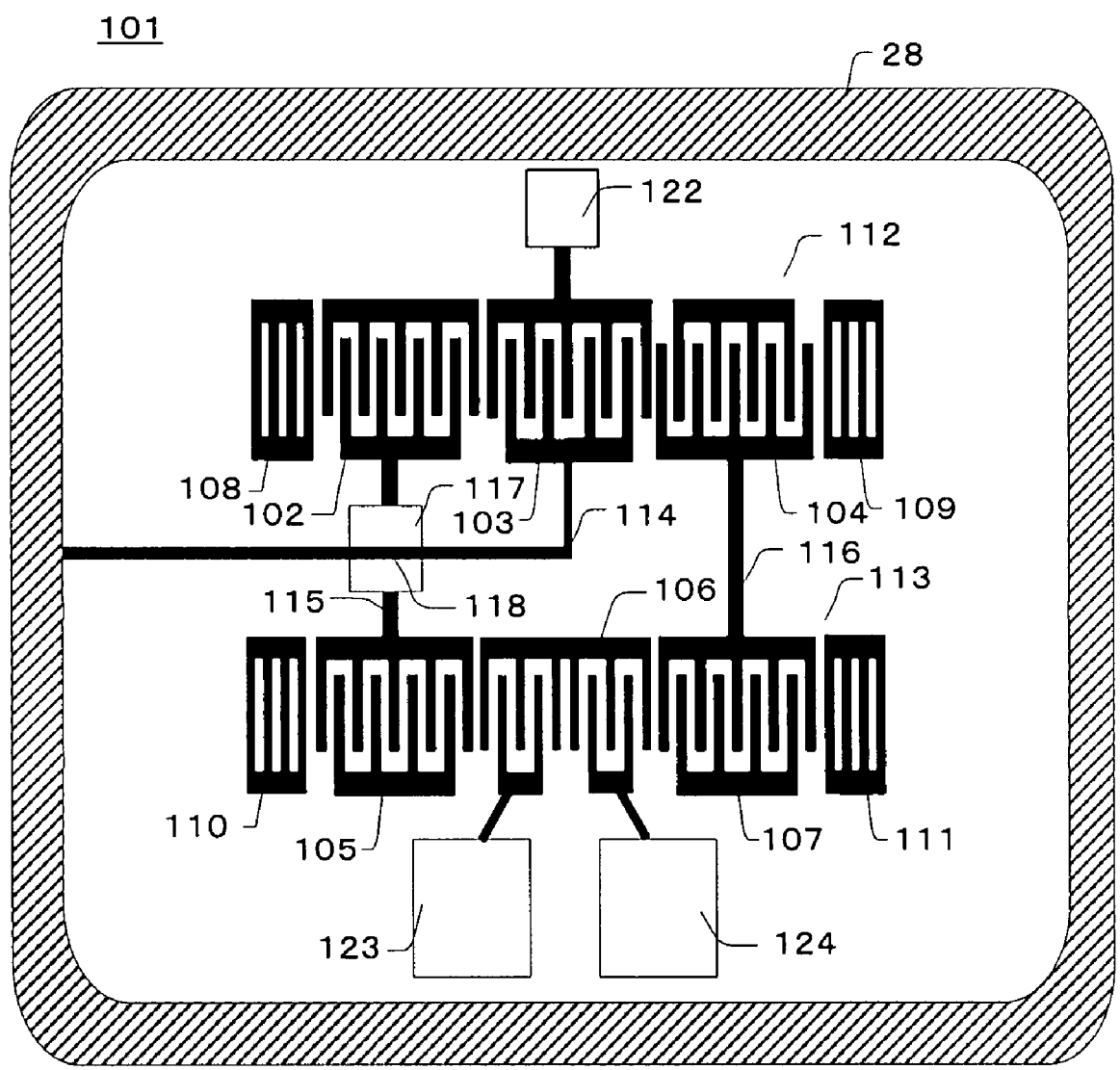
FIG. 5 is a plan view showing a surface acoustic wave device according to another example of the second embodiment of this invention.

A surface acoustic wave device according to another example of the second embodiment of this invention is shown in FIG. 5. While the reference potential wiring 114 is connected with the IDT electrode 106 in the middle of the rear stage surface acoustic wave element 113 in the surface acoustic wave device shown in FIG. 4, a reference potential wiring 114 is connected with an IDT electrode 103 in the middle of a front stage surface acoustic wave element 112 in the surface acoustic wave device shown in FIG. 5. In this case, as in the surface acoustic wave device shown in FIG. 4, a capacitance introduced into an equivalent circuit by a capacitor 118 formed between the front stage surface acoustic wave element 112 and a rear stage surface acoustic wave element 113 can be adjusted between balanced outputs (or balance inputs) to improve the amplitude balance and the phase balance. Also, as described above, there is no need to dispose a ground pad electrode or the like between the front stage surface acoustic wave element 112 and the rear stage surface acoustic wave element 113, the front stage surface acoustic wave element 112 and the rear stage surface acoustic wave element 113 can be placed very closely and it is made possible to layout the ground pad electrode or the like outside a region between the surface acoustic wave elements and to reduce the size of the surface acoustic wave device by reducing an area of the surface acoustic wave elements as much as possible.

Figure 6:
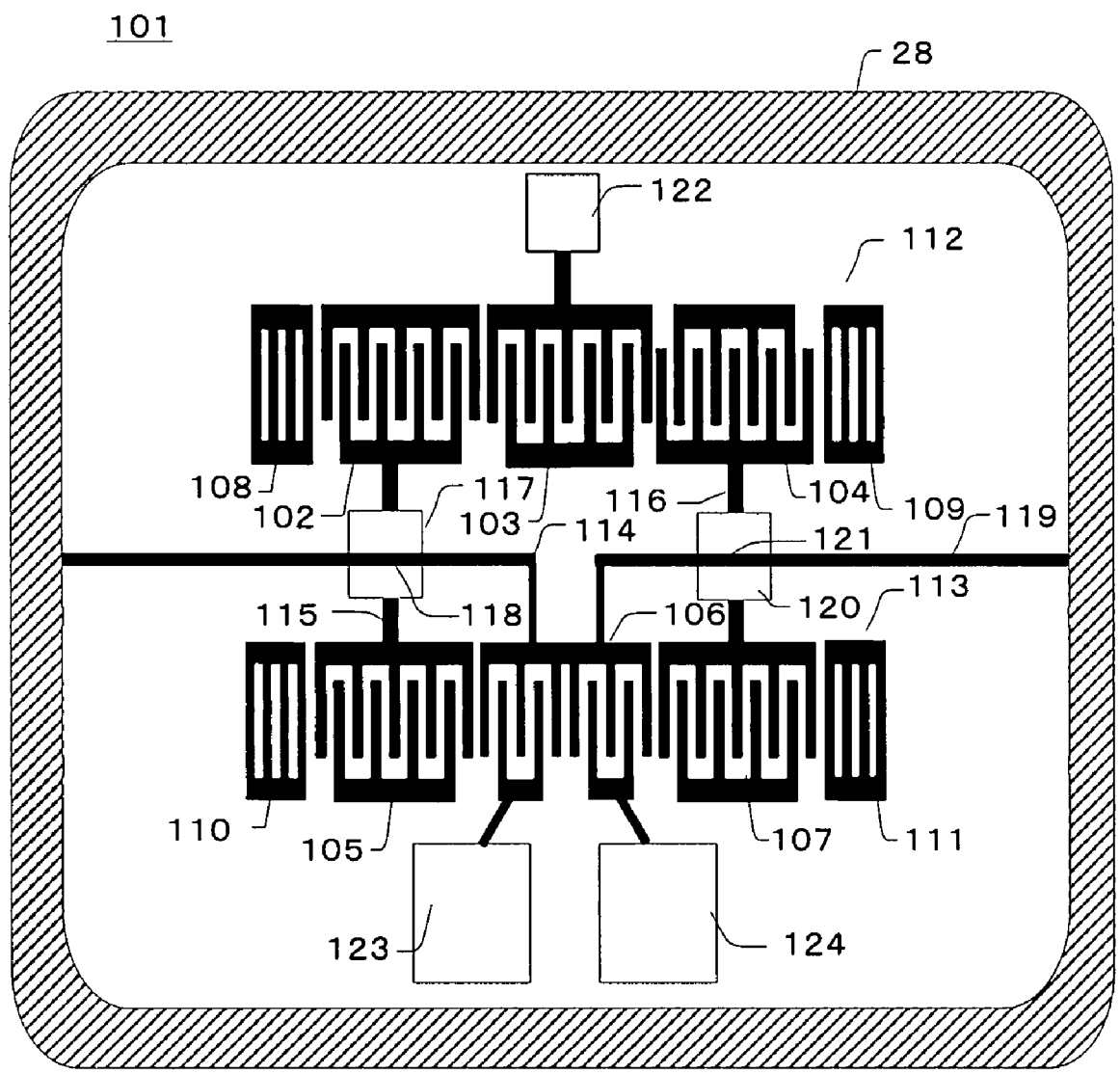
FIG. 6 is a plan view showing a surface acoustic wave device according to still another example of the second embodiment of this invention.

A plan view of a surface acoustic wave device according to still another example of the second embodiment of this invention is shown in FIG. 6. There are formed capacitors 118 and 121 between a front stage surface acoustic wave element 112 and a rear stage surface acoustic wave element 113 at intersections of reference potential wirings 114 and 119 and signal wirings 115 and 116 serially connecting the front stage surface acoustic wave element 112 with the rear stage surface acoustic wave element 113. In this case, as described above, the balance of the surface acoustic wave device can be improved by adjusting two capacitances attached to both locations of serial connections.

Silicon oxide or polyimide resin is favorably used as insulators 117 and 120 used in the capacitors 118 and 121. Insulation between the signal wirings 115 and 116 and the reference potential wirings 114 and 119 can be favorably maintained with it. Desired capacitances can be formed between balanced outputs (or balanced inputs) by adjusting areas of the wirings and thicknesses of the insulators 117 and 120, and the balance of the surface acoustic wave device can be improved with the attached capacitances.

In the structure described above, the reference potential wiring 114 is connected with an annular electrode 28 that is formed on the piezoelectric substrate 101 to surround the surface acoustic wave device, as shown in FIG. 6. With this, as described above, a capacitance introduced into an equivalent circuit of the surface acoustic wave element by the capacitor 118 formed between the front stage surface acoustic wave element 112 and a rear stage surface acoustic wave element 113 can be adjusted in the balanced outputs (or the balance inputs) to improve the amplitude balance and the phase balance.

In addition, with this structure, since the reference potential wiring 114 is connected with the annular electrode 28 formed to surround the surface acoustic wave device, there is no need to dispose a ground pad electrode between the surface acoustic wave elements 112 and 113, ground electrodes can be unified and an area of the surface acoustic wave elements 112 and 113 can be minimized to reduce a size of the surface acoustic wave device.

Also, when an annular conductor is formed on a circuit board in a pattern facing the annular electrode 28 and the surface acoustic wave device is face-down mounted on the circuit board and formed into a structure that is sealed with connecting material such as solder, the surface acoustic wave device can secure good enough hermeticity to offer a surface acoustic wave device that is small in size and excellent in reliability.

And it is also feasible that the capacitors 118 and 121 are formed in both serially connecting portions between the front stage surface acoustic wave element 112 and the rear stage surface acoustic wave element 113, and the reference potential wirings 114 and 119 are connected with the annular electrode 28, as shown in FIG. 6.

The piezoelectric substrate of the surface acoustic wave device is preferably 36°±3° rotated Y-cut X-propagation single crystalline lithium tantalate, 42°±3° rotated Y-cut X-propagation single crystalline lithium tantalate, 64°±3° rotated Y-cut X-propagation single crystalline lithium niobate, 41°±3° rotated Y-cut X-propagation single crystalline lithium niobate or 45°±3° rotated X-cut Z-propagation single crystalline lithium tetraborate. These materials are suitable as the piezoelectric substrate because they have a large electromechanical coupling factor and a small frequency-temperature coefficient.

A piezoelectric substrate made of one of these pyro-piezoelectric single crystalline materials and reduced in pyroelectricity by oxide faults or solid dissolution of Fe or the like is favorable in terms of reliability of the device. A preferable thickness of the piezoelectric substrate is about 0.1-0.5 mm, because a demerit of fragility is small, a material cost is reduced and part dimensions are easily reduced.

On one of principal surfaces of the piezoelectric substrate where the surface acoustic wave elements are formed, conductive connectors of conductive bumps made of gold, solder or the like, which connect the surface acoustic wave device with an external circuit board or the like by face-down flip chip connection, are formed on the unbalanced input/output terminal 17, the balanced input/output terminals 18 and 19 and the reference electric potential electrode (annular electrode) 28 and the like.

The IDT electrodes and the reflector electrodes are made of aluminum or aluminum alloy (Al—Cu or Al—Ti) and are formed by a thin film forming method such as evaporation, sputtering or CVD (Chemical Vapor Deposition). A thickness of the electrodes is preferably about 0.1-0.5 μm to obtain characteristics suitable for a surface acoustic wave filter.

The electrode fingers of the IDT electrodes in the embodiments are drawn in a simplified shape for the sake of the simplicity, because the number of the electrode fingers in the IDT electrode, the reflector electrode or the surface acoustic wave resonator ranges from several to several hundreds.

In the surface acoustic wave devices according to the embodiments, preventing a leakage current due to a foreign material and improving a breakdown voltage can be made by forming a protection film of $SiO_2$, $SiN_x$, Si or $Al_2O_3$ on the electrodes and portions of the surface of the piezoelectric substrate where the surface acoustic waves propagate.

The surface acoustic wave device according to the embodiment of this invention can be applied to a communication device. That is, the surface acoustic device is used as a band-pass filter included in a receiver circuit or a transmitter circuit in the communication device. For example, the surface acoustic wave device can be applied to a communication device provided with a transmitter circuit in which a transmitting signal is mixed with a carrier frequency with a mixer, undesired signals are attenuated by a band-pass filter, the transmitting signal is amplified by a power amplifier, goes through a duplexer and transmitted from an antenna, or can be applied to a communication device provided with a receiver circuit in which a received signal is received with an antenna, amplified by a low noise amplifier after passing through a duplexer, and then undesired signals are attenuated by a band-pass filter, the signal is separated from the carrier frequency by a mixer and extracted. When the surface acoustic wave device according to any of the embodiments of this invention is adopted, it is possible to offer a communication device of reduced power consumption because an insertion loss of the surface acoustic wave device is improved. In addition, a sensitivity of the communication device can be improved since an S/N ratio is improved by the improvement of the insertion loss.

Figure 15:
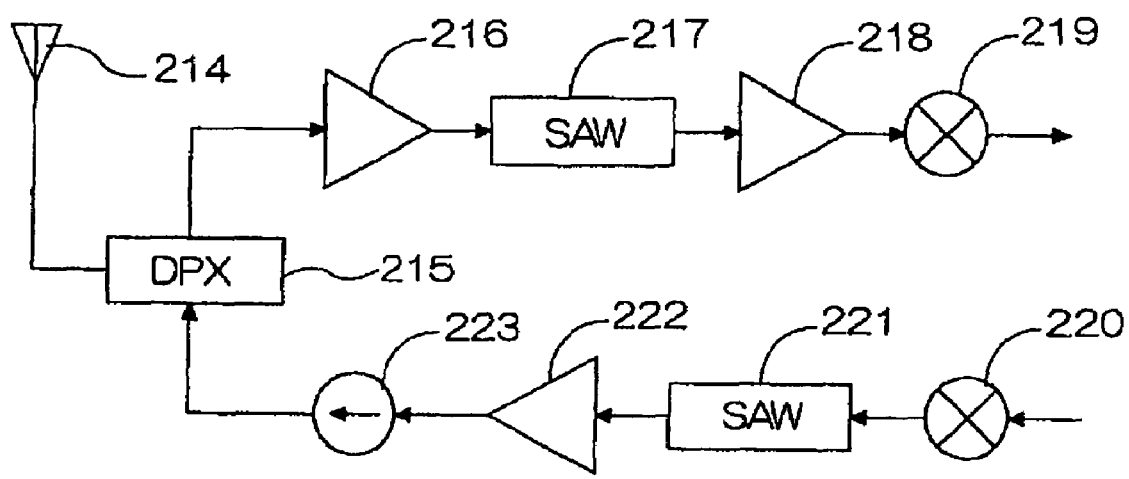
FIG. 15 is a block diagram of an RF circuit with a band-pass filter, which is incorporated in a mobile phone that is a communication device according to an embodiment of this invention.

FIG. 15 shows an example of a block circuit diagram of a high frequency circuit having a band-pass filter and incorporated in a mobile phone, that serves as a communication apparatus. A transmission signal (high frequency signal) is superimposed on a carrier wave signal to make an antenna transmission signal by a mixer 220. An unnecessary signal in the antenna transmission signal is attenuated by a surface acoustic wave device 221 that serves as a band-pass filter. After amplified by a power amplifier 222, the antenna transmission signal goes through an isolator 223 and a surface acoustic wave branching filter (duplexer) 215 and radiates from an antenna 214. And an antenna received signal received by the antenna 214 goes through the surface acoustic wave branching filter 215 and is amplified by a low noise amplifier 216. After its unnecessary signal is attenuated by a surface acoustic wave device 217 that serves as a band-pass filter, the amplified antenna received signal is amplified again by an amplifier 218 and is transformed into a low frequency signal by a mixer 219.

In the embodiments described above, the examples of the surface acoustic wave devices provided with three IDT electrodes that are disposed along the propagation direction of the surface acoustic waves propagating through the surface of the piezoelectric substrate and have the plurality of electrode fingers extending perpendicular to the propagation direction are shown for the sake of simplicity. However, the surface acoustic wave device is not limited to the above, and may be provided with five or more than five odd-number of IDT electrodes. The surface acoustic wave device may be modified as appropriate into other structures, as long as they are within the scope of this invention.

First Embodiment

An example of manufacturing and evaluation of the surface acoustic wave device according to the first embodiment shown in FIG. 1 will be described in detail.

Fine electrode patterns made of an alloy of 99 weight % Al and 1 weight % Cu and constituting the first and second surface acoustic wave elements 14 and 15 were formed on a piezoelectric substrate (a mother substrate that is to be divided into a plurality of individual substrates) 1 made of 38.7° rotated Y-cut X-propagation single crystalline $LiTaO_3$.

The electrode patterns were formed by photolithography using a sputtering apparatus, a stepper and an RIE (Reactive Ion Etching) apparatus.

First, the piezoelectric substrate 1 was ultrasonically cleaned using acetone, isopropyl alcohol or the like to remove organic substances. After drying the piezoelectric substrate 1 sufficiently in a clean oven, a film of metal layer to make the electrodes was formed. The metal layer was formed by the sputtering apparatus using the alloy of 99 weight % Al and 1 weight % Cu as material. A thickness of the metal layer was 0.18 µm.

Next, a photoresist layer of about 0.5 µm was spin-coated on the metal layer, subjected to patterning into a desired shape with the stepper, and formed into the desired shape by dissolving unnecessary portions of the photoresist layer in an alkali development solution with a development apparatus. After that, the metal layer was etched with the RIE apparatus to complete the patterning and obtain the pattern of the electrodes constituting the surface acoustic wave device.

Next, a protection film was formed on predetermined regions of the electrodes. That is, a $SiO_2$ layer of a thickness of about 0.1 µm was formed on the pattern of the electrodes and the piezoelectric substrate 1 with a CVD apparatus.

Next, for forming of the wirings disposed to intersect through the insulators, patterning by the photography was performed so that the insulators were formed at the intersections of each of the signal wirings 22 and 23 and each of the reference potential wirings 20 and 21, respectively. Next, patterning by the lithography was performed to form connecting electrodes that were for connection between the reference potential wirings 20 and 21 drawn from a common electrode of the IDT electrodes 3 and 6 and the annular electrode 28 and disposed on the insulators at the intersections of the signal wirings 22 and 23 and the reference potential wirings 20 and 21.

At that time, because the $SiO_2$ layer prevented electrical connection at the connecting electrodes and connecting portions between the reference potential wirings 20 and 21 and the annular electrode 28, etching process was performed by dry etching with the RIE apparatus in order to form windows in the $SiO_2$ layer at corresponding portions.

Furthermore, windows to accommodate the conductive connectors to connect the surface acoustic wave device with the external circuit board or the like by face-down flip chip connection were formed by etching the $SiO_2$ layer using the RIE apparatus or the like on one of the principal surfaces of the piezoelectric substrate 1, where the surface acoustic wave elements were formed. After that, the unbalanced input/output terminals, the balanced input/output terminals and the reference electric potential electrode (annular electrode) having a structure of stacked layers of a Cr layer, a Ni layer and an Au layer were formed in the windows using the sputtering apparatus. A thickness of each of the unbalanced input/output terminals, the balanced input/output terminals and the reference electric potential electrode was about 1.0 µm. After that, the photoresist and the Cr layer, Ni layer and the Au layer in unnecessary portions were removed simultaneously by the lift-off method, and the unbalanced input/output terminals, the balanced input/output terminals and the reference electric potential electrode to form the conductive connectors were completed.

Next, the conductive connectors for flip chip connection made of solder were formed on the unbalanced input/output terminals, balanced input/output terminals and the reference electric potential electrode by printing.

Next, the piezoelectric substrate 1 was diced along dicing lines and separated into individual surface acoustic wave devices (chips). After that, each chip was bonded to and housed in a package by a flip chip mounting apparatus with the surface, on which the reference electric potential electrode and the others were formed, facing downward. After that, baking was performed in an $N_2$ atmosphere and the packaged surface acoustic wave device was completed. A stacked structure of 2.5 mm×2.0 mm made of multiple ceramic layers was used as the package.

Figure 7:
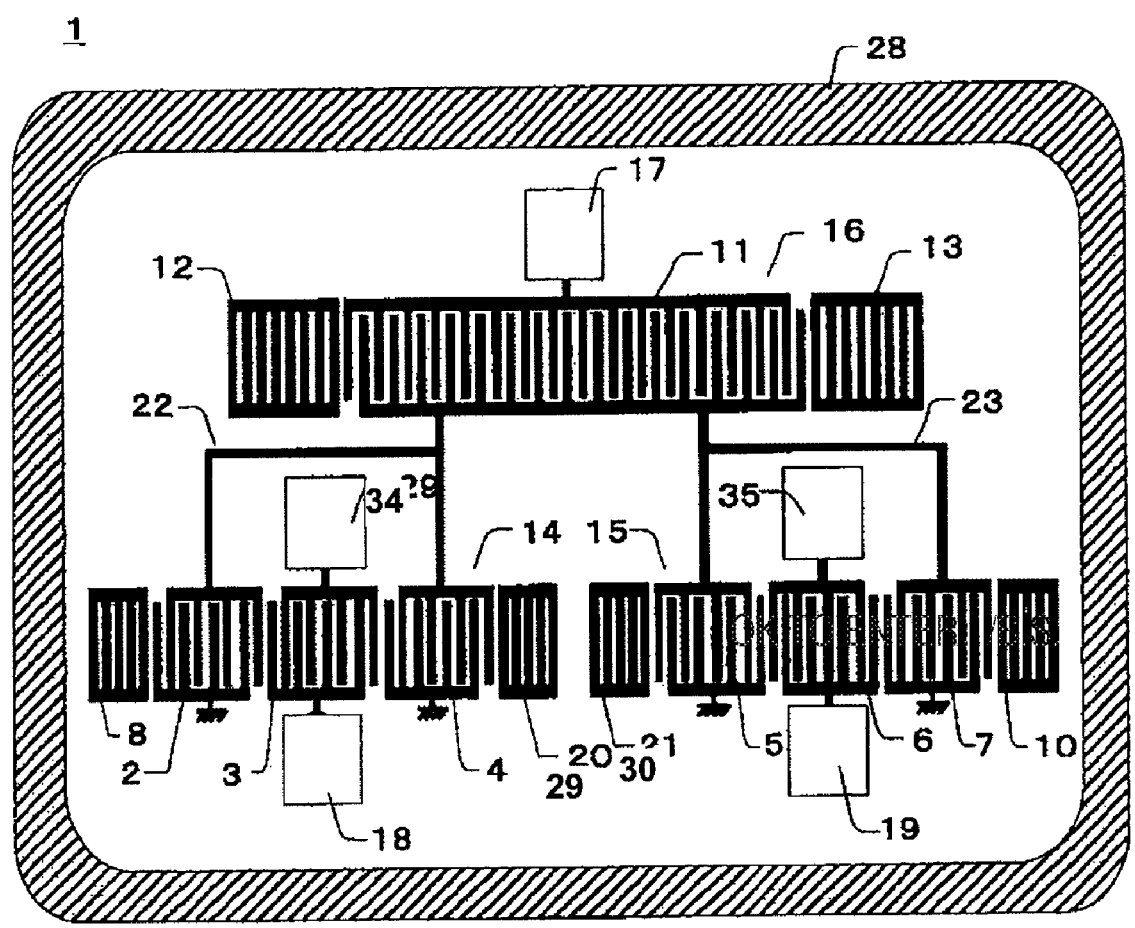
FIG. 7 is a plan view showing a structure of electrodes in a surface acoustic wave device of a first reference example.

As a sample of a first reference, there was manufactured by the same manufacturing process as described above a surface acoustic wave device having a surface acoustic wave resonator 16 and first and second surface acoustic wave elements 14 and 15, in which ground pad electrodes 34 and 35 were formed between the surface acoustic wave resonator 16 and the first and second surface acoustic wave elements 14 and 15 but an intersection of the signal wiring 22 or 23 and a reference potential wiring was not formed, as shown in FIG. 7.

Features of a structure of the sample of the first reference other than those described above are the same as those of the surface acoustic wave device according to the first embodiment shown in FIG. 1.

Characteristics of the surface acoustic wave devices according to the first embodiment and the first reference were measured. A signal of 0 dB was inputted and measurements were performed for a frequency range of 1640-2140 MHz and for measurement points of 801. The number of samples was 30 each, and measurement equipment was a multi-port network analyzer (Agilent Technologies E5071A).

Figure 8:
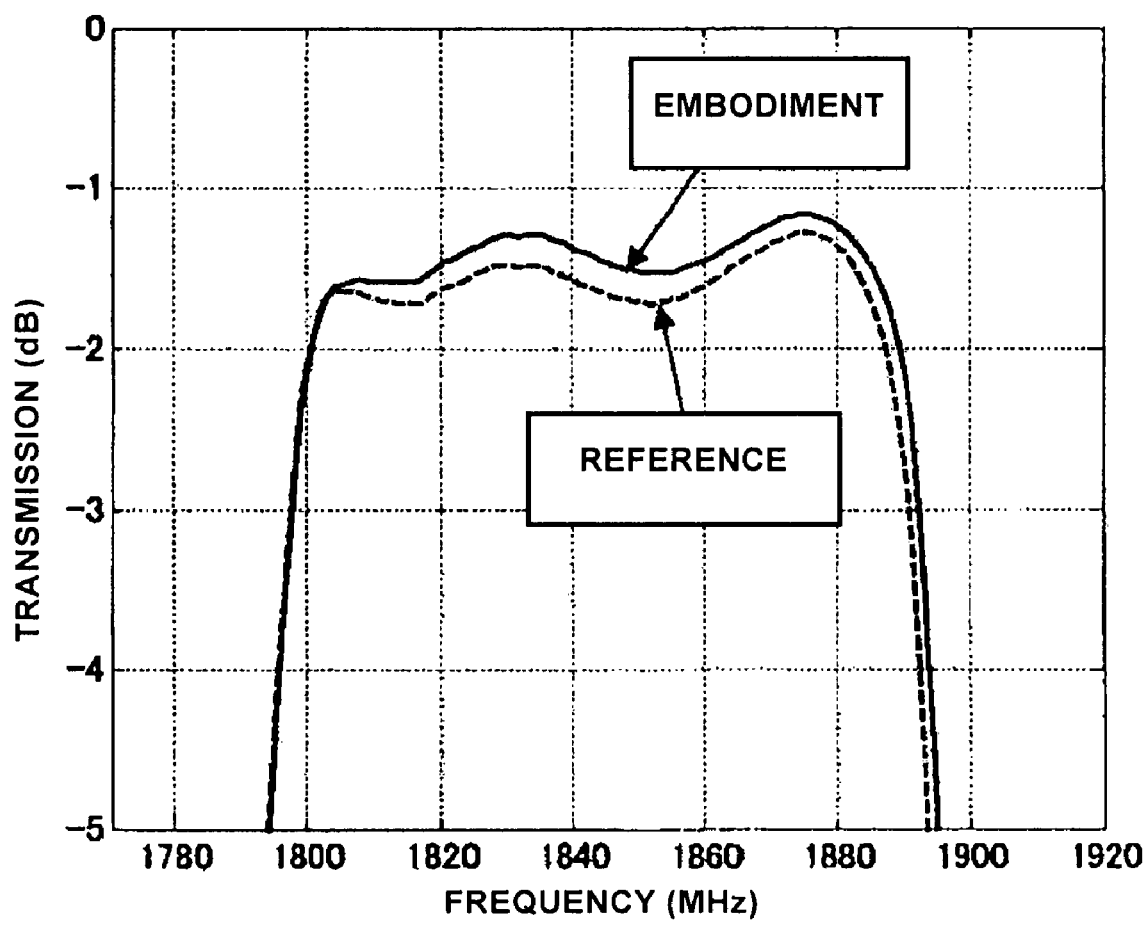
FIG. 8 is a diagram showing frequency characteristics of insertion loss in and around a pass band regarding the surface acoustic wave devices of the first embodiment and the first reference example.

A graph of frequency characteristics around the pass band obtained from the measurements is shown in FIG. 8. FIG. 8 is the graph showing frequency dependence of the insertion loss that represents transmission characteristics of the surface acoustic wave device as a frequency filter. Filter characteristics of the surface acoustic wave device according to the first embodiment was very good. That is, good filter characteristics showing improvement in the insertion loss were obtained as depicted by a solid line in FIG. 8.

On the other hand, filter characteristics in the pass band of the surface acoustic wave device according to the first reference show degradation in the insertion loss as depicted by a dashed line in FIG. 8. The surface acoustic wave device according to the first embodiment has improved the insertion loss in the pass band by 0.3 dB compared with the surface acoustic wave device according to the first reference.

Figure 9:
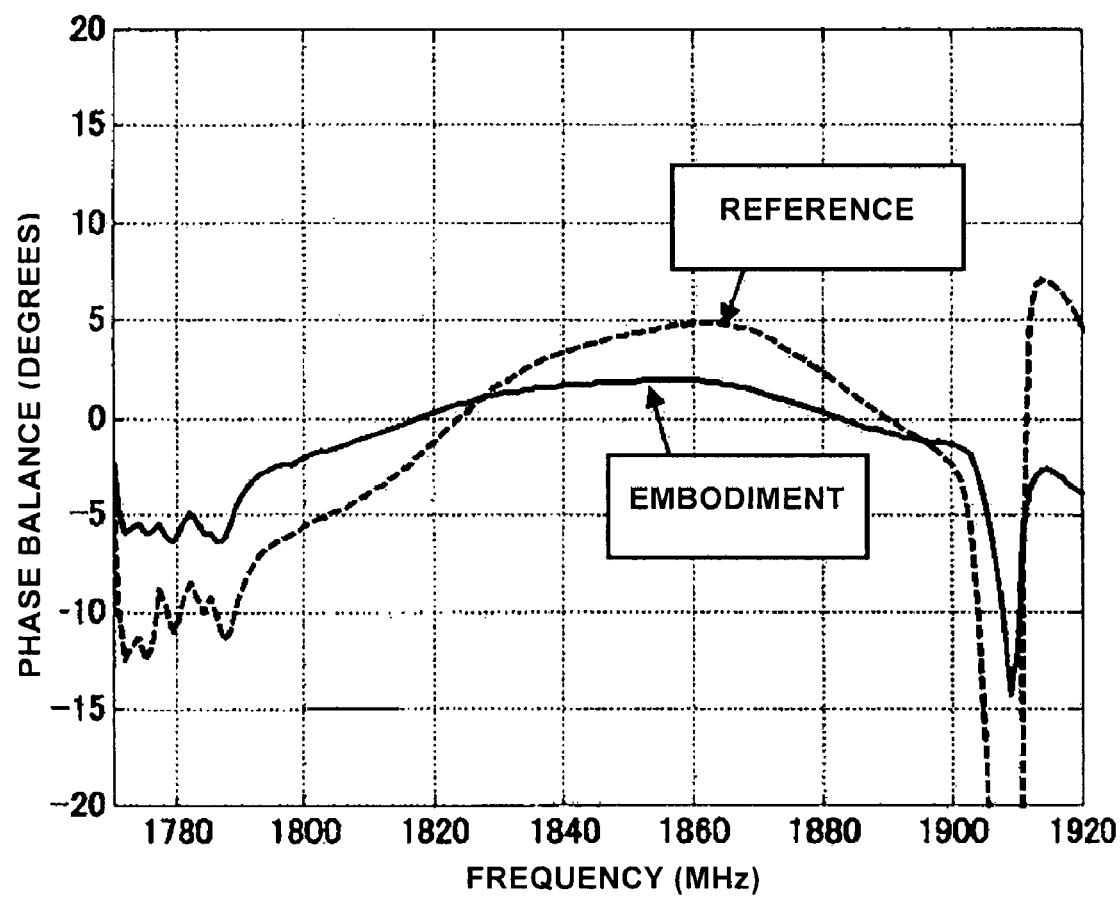
FIG. 9 is a diagram showing frequency dependence of phase balance in and around the pass band regarding the surface acoustic wave devices of the first embodiment and the first reference example.

Also, a graph of phase balance around the pass band regarding the surface acoustic wave devices according to the first embodiment and the first reference is shown in FIG. 9. The phase balance of the surface acoustic wave device according to the first embodiment was very good with stable and flat characteristics over the pass band, as depicted by a solid line in FIG. 9. The phase balance of the surface acoustic wave device according to the first reference does not show stable characteristics over the pass band, as depicted by a dashed line in FIG. 9. As described above, it was made possible to improve the balance in the pass band of the surface acoustic wave device according to the first embodiment.

According to the first embodiment, as described above, it was made possible to realize the surface acoustic wave device with which the insertion loss was improved and also the balance was improved. In addition, the surface acoustic wave device according to the first embodiment was reduced by 10% in the area of the principal surface, on which the surface acoustic wave elements and the others were formed, compared with the surface acoustic wave device according to the first reference.

Second Embodiment

An example of manufacturing and evaluation of the surface acoustic wave device according to the second embodiment shown in FIG. 4 will be described in detail.

Fine electrode patterns made of an alloy of 99 weight % Al and 1 weight % Cu were formed on a piezoelectric substrate (a mother substrate that is to be divided into a plurality of individual substrates) 101 made of 38.7° rotated Y-cut X-propagation single crystalline $LiTaO_3$.

The electrode patterns were formed by photolithography using a sputtering apparatus, a stepper and an RIE apparatus.

First, the piezoelectric substrate 101 was ultrasonically cleaned using acetone, isopropyl alcohol or the like to remove organic substances. After drying the piezoelectric substrate 101 sufficiently in a clean oven, a film of metal layer to make the electrodes was formed. The metal layer was formed by the sputtering apparatus using the alloy of 99 weight % Al and 1 weight % Cu as material. A thickness of the metal layer was 0.18 μm.

Next, a photoresist layer of about 0.5 μm was spin-coated on the metal layer, subjected to patterning into a desired shape with a stepper, and formed into the desired shape by dissolving unnecessary portions of the photoresist layer in an alkali development solution with a development apparatus. After that, the metal layer was etched with the RIE apparatus to complete the patterning and obtain the pattern of the electrodes constituting the surface acoustic wave device.

After that, a protection film was formed on predetermined regions of the electrodes. That is, a $SiO_2$ layer of a thickness of about 1.0 μm was formed on the pattern of the electrodes and the piezoelectric substrate 101 with CVD apparatus.

After that, patterning by photolithography and dry etching with the RIE apparatus were performed to form windows in the $SiO_2$ layer at locations corresponding to connecting portions of the common electrode with the reference potential wiring 114 and the IDT electrode 106. After patterning by photography was performed, the $SiO_2$ layer in a region other than the capacitor 118 was etched with the RIE apparatus or the like to reduce the thickness to 0.2 μm.

After that, the reference potential wiring 114 was formed of Al—Cu alloy using the sputtering apparatus. Further, after patterning by the lithography was performed, etching was performed with the RIE apparatus to form windows in the $SiO_2$ layer for the flip chip connection. After that, the unbalanced input/output terminals, the balanced input/output terminals and the reference electric potential electrode (annular electrode) having a structure of stacked layers of a Cr layer, a Ni layer and an Au layer were formed in the windows using the sputtering apparatus. A thickness of each of the unbalanced input/output terminals, the balanced input/output terminals and the reference electric potential electrode was about 1.0 μm. After that, the photoresist and the Cr layer, Ni layer and the Au layer in unnecessary portions were removed simultaneously by the lift-off method, and the unbalanced input/output terminals, the balanced input/output terminals and the reference electric potential electrode to form the conductive connectors were completed.

Next, the conductive connectors for flip chip connection made of solder were formed on the unbalanced input/output terminals, balanced input/output terminals and the reference electric potential electrode by printing.

Next, the piezoelectric substrate 101 was diced along dicing lines and separated into individual surface acoustic wave devices (chips). After that, each chip was bonded to and housed in a package by a flip chip mounting apparatus with the surface, on which the reference electric potential electrode and the others were formed, facing downward. After that, baking was performed in an $N_2$ atmosphere and the packaged surface acoustic wave device was completed. A stacked structure of 2.5 mm×2.0 mm made of multiple ceramic layers was used as the package.

Figure 10:
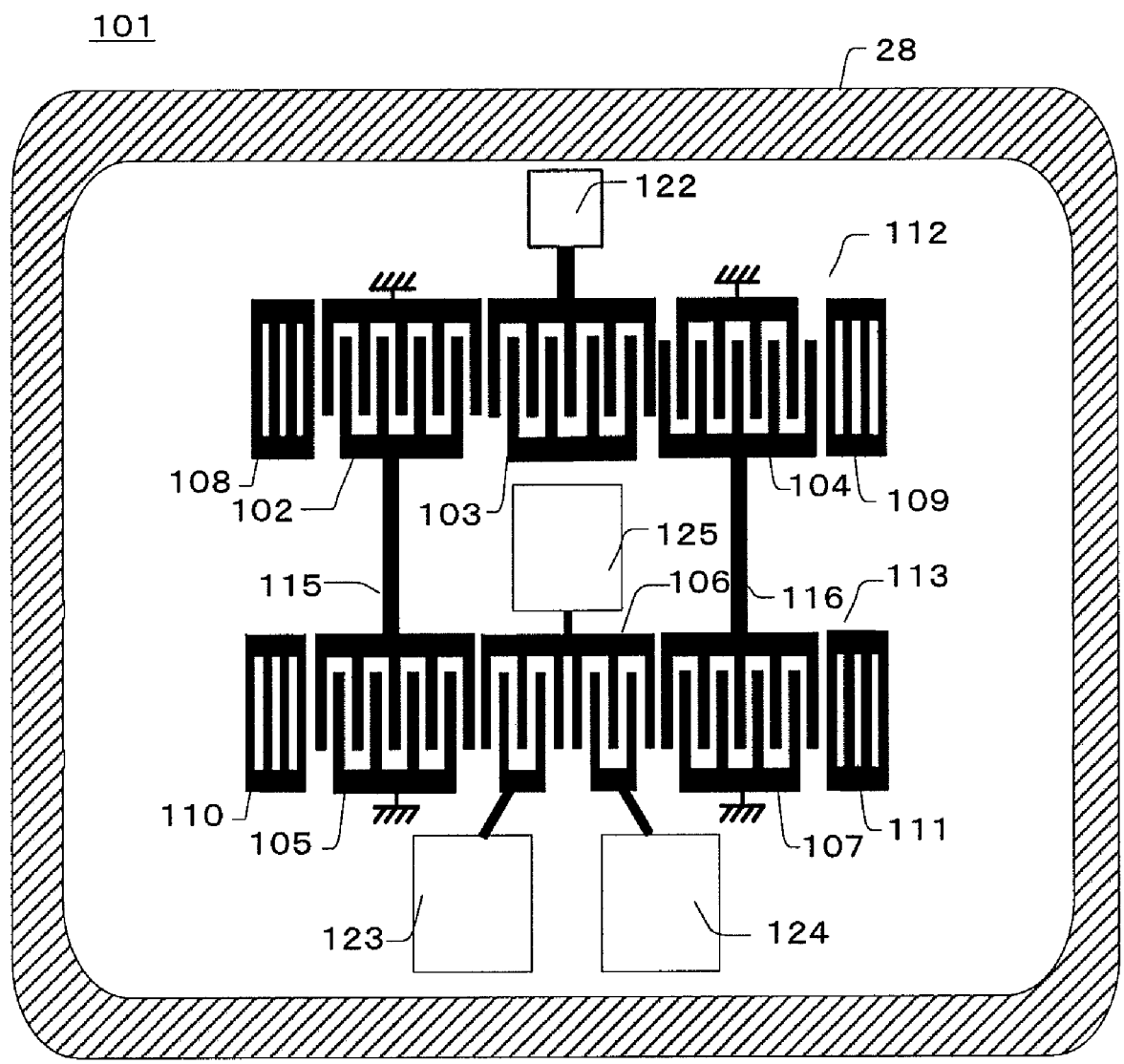
FIG. 10 is a plan view schematically showing a structure of electrodes in a surface acoustic wave device of a second reference example.

As a sample of a second reference, there was manufactured by the same manufacturing process as described above a surface acoustic wave device having a front stage surface acoustic wave element 112 and a rear stage surface acoustic wave element 113, in which ground pad electrode 125 was formed between the front stage surface acoustic wave element 112 and the rear stage surface acoustic wave element 113 but an intersection of a signal wiring 115 or 116 and a reference potential wiring was not formed, as shown in FIG. 10.

Features of a structure of the sample of the second reference other than those described above are the same as those of the surface acoustic wave device according to the second embodiment shown in FIG. 4.

Characteristics of the surface acoustic wave devices according to the second embodiment and the second reference were measured. A signal of 0 dB was inputted and measurements were performed for a frequency range of 840-1040 MHz and for measurement points of 801. The number of samples was 30 each, and measurement equipment was the multi-port network analyzer (Agilent Technologies E5071A).

Figure 11:
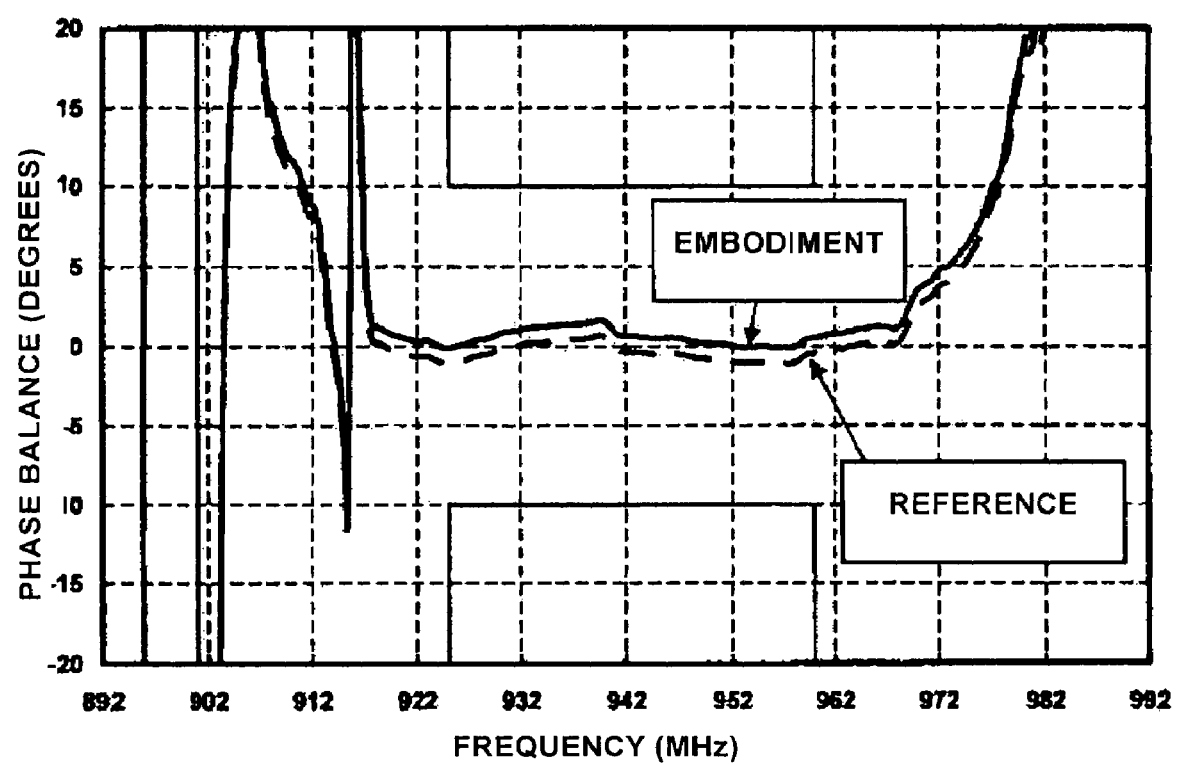
FIG. 11 is a diagram showing frequency dependence of phase balance in and around a pass band of the surface acoustic wave devices of the second embodiment and the second reference example.
Figure 12:
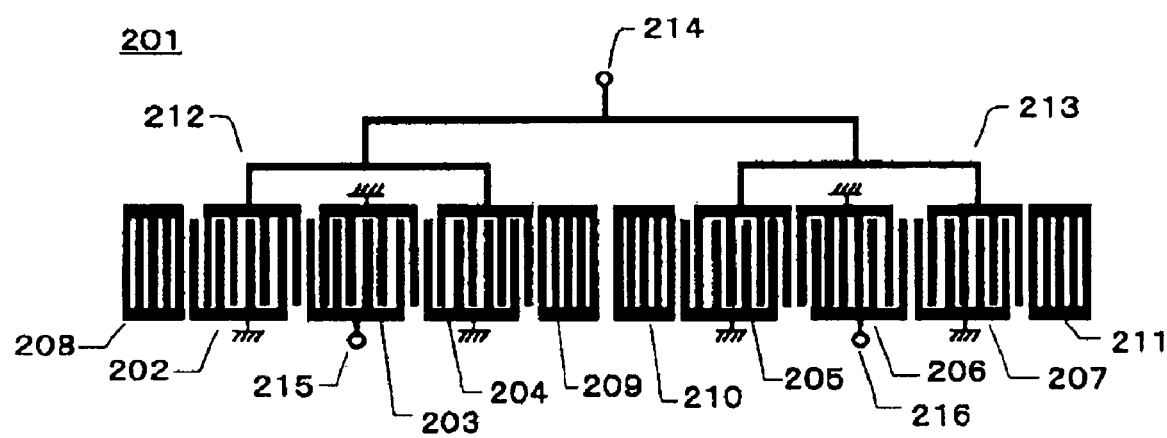
FIG. 12 is a plan view showing an example of a structure of electrodes in a conventional surface acoustic wave device.
Figure 13:
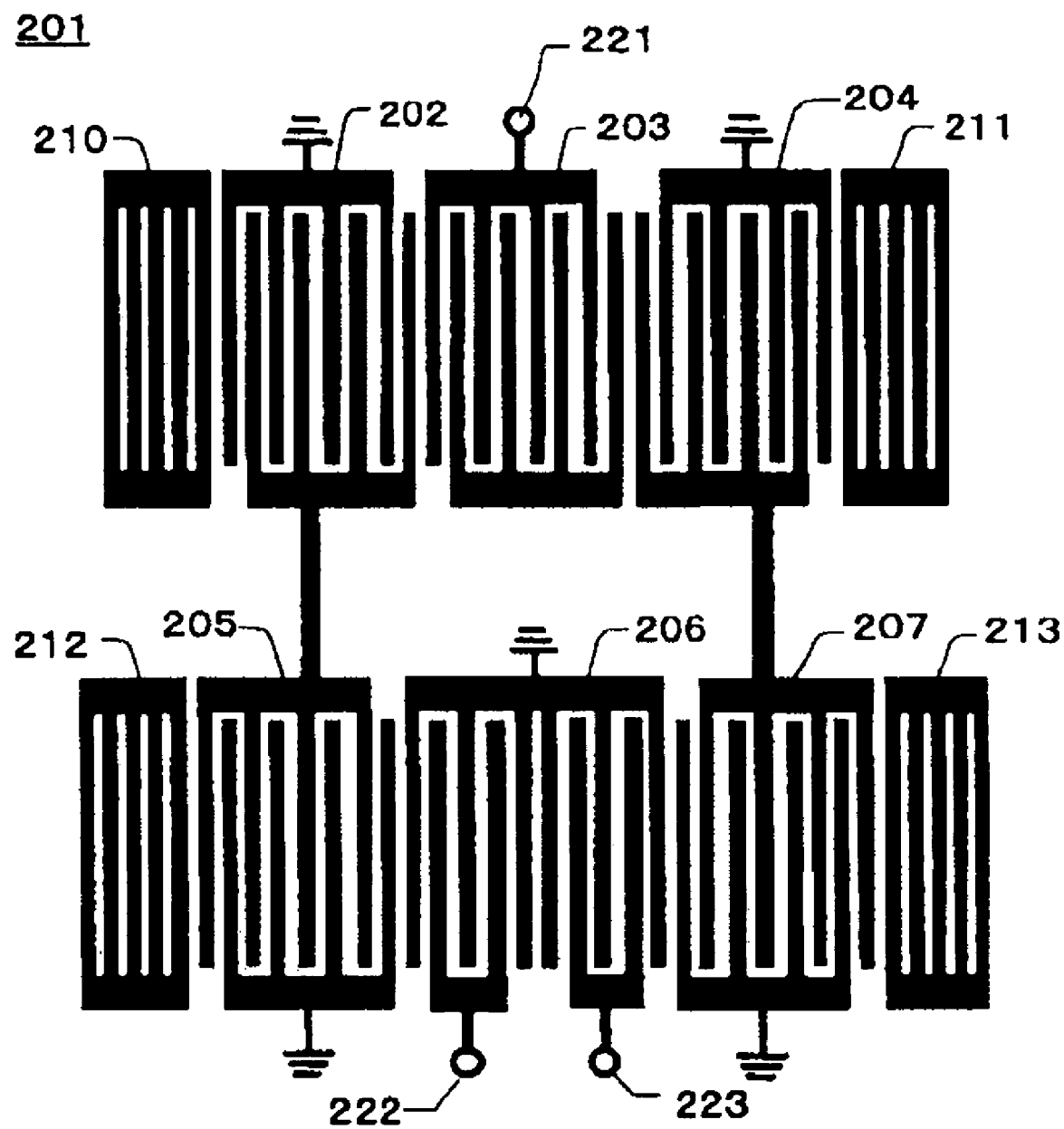
FIG. 13 is a plan view showing another example of the structure of electrodes in the conventional surface acoustic wave device.

A graph of phase balance around the pass band in the surface acoustic wave devices according to the second embodiment and the second reference is shown in FIG. 11. The phase balance of the surface acoustic wave device according to the second embodiment was very good with stable and flat characteristics over the pass band, as depicted by a solid line in FIG. 11. It was made possible to improve the phase balance in the pass band of the surface acoustic wave device according to the second embodiment, compared with the phase balance of the surface acoustic wave device according to the second reference, which is depicted by a dashed line in FIG. 11.

According to the second embodiment, as described above, it was made possible to realize the surface acoustic wave device with which generation of small ripples in the pass band was suppressed, the insertion loss was improved, and also the balance was improved. In addition, the surface acoustic wave device according to the second embodiment was reduced by 10% in the area of the principal surface, on which the surface acoustic wave elements and the others were formed, compared with the surface acoustic wave device according to the second reference.

What is claimed is:

1. A surface acoustic wave device comprising:
   a front stage surface acoustic wave resonator comprising an IDT electrode;
   a first rear stage surface acoustic wave element and a second rear stage surface acoustic wave element connected in parallel through the first stage surface acoustic wave resonator, each of the first and second rear stage surface acoustic wave elements comprising three or more than three odd-number of IDT electrodes;
   a signal wiring connecting between the IDT electrode of the front stage surface acoustic wave resonator and the IDT electrode of one of the first and second rear stage surface acoustic wave elements;
   a reference potential wiring connecting between the IDT electrode of the one of the first and second rear stage surface acoustic wave elements and a reference electric potential electrode;
   a capacitor comprising a portion of the signal wiring, a portion of the reference potential wiring facing the portion of the signal wiring and an insulator interposed between the portion of the signal wiring and the portion of the reference potential wiring;

an unbalance input/output terminal connected with the IDT electrode of the front stage surface acoustic wave resonator; and two balanced output/input terminals each connected with the IDT electrode of each of the rear stage surface acoustic wave elements, respectively, wherein a width of the portion of the reference potential wiring is different from a width of the portion of the signal wiring.

2. The surface acoustic wave device of claim 1, wherein the insulator comprises silicon oxide or polyimide resin.

3. The surface acoustic wave device of claim 2, wherein the insulator comprises a particle of an insulative material that has a dielectric constant different from a dielectric constant of the insulator, or the insulator comprises a particle of a metal.

4. The surface acoustic wave device of claim 1, wherein the reference electric potential electrode comprises an annular electrode formed to surround the front stage surface acoustic wave resonator, the first and second rear stage surface acoustic wave elements, the signal wiring, the reference potential wiring, the capacitor, the unbalanced input/output terminal and the balanced output/input terminals.

5. The surface acoustic wave device of claim 1, wherein one of the first and second rear stage surface acoustic wave elements is provided with the reference potential wiring.

6. The surface acoustic wave device of claim 1, wherein the first rear stage surface acoustic wave element is provided with the reference potential wiring that forms one of the capacitor and the second rear stage surface acoustic wave element is provided with the reference potential wiring that forms another of the capacitor.

7. The surface acoustic wave device of claim 6, wherein materials of the insulators forming the two capacitors are different from each other.

8. The surface acoustic wave device of claim 6, wherein widths of the insulators forming the two capacitors are different from each other.

9. A communication device comprising the surface acoustic wave device of claim 1, comprising:

a mixer for mixing a transmission signal with a carrier signal to generate an antenna transmission signal;

a band-pass filter comprising the surface acoustic wave device and attenuating an unnecessary signal in the antenna transmission signal; and a power amplifier amplifying the antenna transmission signal and outputting the amplified antenna transmission signal to an antenna through a duplexer.

10. A communication device comprising the surface acoustic wave device of claim 1, comprising:

an antenna;

a low noise amplifier amplifying an antenna reception signal that has been received by the antenna and has passed through a duplexer;

a band-pass filter comprising the surface acoustic wave device and attenuating an unnecessary signal in the antenna reception signal amplified by the low noise amplifier; and a mixer separating a reception signal from a carrier signal in the antenna reception signal that has passed through the band-pass filter.

11. A surface acoustic wave device comprising:

a front stage surface acoustic wave element comprising three or more than three odd-number of IDT electrodes;

a rear stage surface acoustic wave element comprising three or more than three odd-number of IDT electrodes;

a signal wiring connecting between the IDT electrode of the front stage surface acoustic wave element and the IDT electrode of the rear stage surface acoustic wave element;

a reference potential wiring connecting between the IDT electrode of one of the front and rear stage surface acoustic wave elements and a reference electric potential electrode;

a capacitor comprising a portion of the signal wiring, a portion of the reference potential wiring facing the portion of the signal wiring and an insulator interposed between the portion of the signal wiring and the portion of the reference potential wiring;

an unbalance input/output terminal connected with the IDT electrode of the front stage surface acoustic wave element; and two balanced output/input terminals each connected with one of the IDT electrodes of the rear stage surface acoustic wave element, wherein a width of the portion of the reference potential wiring as different from a width of the portion of the signal wiring.

12. The surface acoustic wave device of claim 11, wherein the insulator comprises silicon oxide or polyimide resin.

13. The surface acoustic wave device of claim 12, wherein the insulator comprises a particle of an insulative material that has a dielectric constant different from a dielectric constant of the insulator, or the insulator comprises a particle of a metal.

14. The surface acoustic wave device of claim 11, wherein the reference electric potential electrode comprises an annular electrode formed to surround the front and rear stage surface acoustic wave elements, the signal wiring, the reference potential wiring, the capacitor, the unbalanced input/output terminal and the balanced output/input terminals.

15. The surface acoustic wave device of claim 11, further comprising another of the capacitor, wherein materials of the insulators forming the two capacitors are different from each other.

16. The surface acoustic wave device of claim 11, further comprising another of the capacitor, wherein widths of the insulators forming the two capacitors are different from each other.

17. A communication device comprising the surface acoustic wave device of claim 11, comprising:

a mixer for mixing a transmission signal with a carrier signal to generate an antenna transmission signal;

a band-pass filter comprising the surface acoustic wave device and attenuating an unnecessary signal in the antenna transmission signal; and a power amplifier amplifying the antenna transmission signal and outputting the amplified antenna transmission signal to an antenna through a duplexer.

18. A communication device comprising the surface acoustic wave device of claim 11, comprising:

an antenna;

a low noise amplifier amplifying an antenna reception signal that has been received by the antenna and has passed through a duplexer;

a band-pass filter comprising the surface acoustic wave device and attenuating an unnecessary signal in the antenna reception signal amplified by the low noise amplifier; and a mixer separating a reception signal from a carrier signal in the antenna reception signal that has passed through the band-pass filter.

* * * * *